US007524346B2

(12) United States Patent
Small et al.

(10) Patent No.: US 7,524,346 B2
(45) Date of Patent: Apr. 28, 2009

(54) COMPOSITIONS OF CHEMICAL MECHANICAL PLANARIZATION SLURRIES CONTACTING NOBLE-METAL-FEATURED SUBSTRATES

(75) Inventors: Robert J. Small, Dublin, CA (US); Zhefei J. Chen, Los Altos, CA (US)

(73) Assignee: DuPont Air Products NanoMaterials LLC, Tempe, AZ (US)

( * ) Notice: Subject to any disclaimer, the term of this patent is extended or adjusted under 35 U.S.C. 154(b) by 0 days.

(21) Appl. No.: 10/057,206

(22) Filed: Jan. 25, 2002

(65) Prior Publication Data

US 2003/0194879 A1     Oct. 16, 2003

(51) Int. Cl.
*C09G 1/00* (2006.01)
*C09G 1/02* (2006.01)
*C09G 1/04* (2006.01)

(52) U.S. Cl. .............................. 51/307; 51/308; 51/309; 106/3; 216/89; 216/96; 438/692; 438/693

(58) Field of Classification Search .................... 51/307, 51/308, 309; 106/3; 252/79.1, 79.5; 438/692, 438/693; 216/89, 100, 96; 219/100
See application file for complete search history.

(56) References Cited

U.S. PATENT DOCUMENTS

| | | | |
|---|---|---|---|
| 4,959,113 A | 9/1990 | Roberts | |
| 5,318,927 A | 6/1994 | Sandhu et al. | |
| 5,527,423 A | 6/1996 | Neville et al. | |
| 5,976,928 A | 11/1999 | Kirlin et al. | |
| 5,980,775 A | 11/1999 | Grumbine et al. | |
| 5,993,686 A * | 11/1999 | Streinz et al. | 252/79.3 |
| 6,063,306 A * | 5/2000 | Kaufman et al. | 252/79.4 |
| 6,117,775 A | 9/2000 | Kondo et al. | |
| 6,169,305 B1 | 1/2001 | Takai et al. | |
| 6,293,848 B1 | 9/2001 | Fang et al. | |
| 6,299,795 B1 | 10/2001 | Liu et al. | |
| 6,332,831 B1 | 12/2001 | Shemo et al. | |
| 6,461,227 B1 | 10/2002 | Fang | |
| 6,527,622 B1 * | 3/2003 | Brusic et al. | 451/28 |
| 6,589,100 B2 * | 7/2003 | Moeggenborg et al. | 451/41 |
| 6,783,434 B1 * | 8/2004 | Akahori et al. | 451/41 |
| 2001/0037821 A1 | 11/2001 | Staley et al. | |
| 2001/0044264 A1 * | 11/2001 | Lack et al. | 451/60 |
| 2002/0042208 A1 | 4/2002 | Beitel et al. | 438/745 |
| 2002/0076932 A1 * | 6/2002 | Dirksen | 438/690 |
| 2002/0111027 A1 * | 8/2002 | Sachan et al. | 438/692 |
| 2002/0125460 A1 * | 9/2002 | Tredinnick | 252/79.1 |
| 2003/0060135 A1 * | 3/2003 | Moeggenborg et al. | 451/141 |
| 2003/0119316 A1 * | 6/2003 | Klein et al. | 438/689 |
| 2003/0139116 A1 * | 7/2003 | Moeggenborg et al. | 451/28 |
| 2003/0153183 A1 * | 8/2003 | Konno et al. | 438/689 |
| 2003/0153184 A1 * | 8/2003 | Wang et al. | 438/689 |

FOREIGN PATENT DOCUMENTS

EP     1111083 A2     6/2001

| | | |
|---|---|---|
| WO | 99/27581 | 6/1999 |
| WO | 00/31794 | 6/2000 |

OTHER PUBLICATIONS

Results of Search by NERAC Inc., bearing date of May 14, 1999 (21 pages) containing items AI-BT.
1) Abstract and bibliographic information concerning journal article British Corrosion Journal 26, (4), (1991) (pp. 265-267).
2) Abstract and bibliographic information concerning journal article Sov. Electrochem. 27, (2), (Feb. 1991), (pp. 252-255).
3) Abstract and bibliographic information concerning journal article Praktische Metallographie 30, (6), (Jun. 1993), (pp. 306-311).
4) Abstract and bibliographic information concerning conference proceedings Euocorr '87 European Corrosion Meeting, (1987), (pp. 209-214).
5) Abstract and bibliographic information concerning journal article Elektrokhimiya 18, (6), (Jun. 1982), (pp. 848-850).
6) Abstract and bibliographic information concerning journal article Prot. Met. (USSR) 15, (5), (Sep.-Oct. 1979), (pp. 450-452).
7) Abstract and bibliographic information concerning journal article Zashch. Met. 15, (5), (1979), (pp. 560-562).
8) Abstract and bibliographic information concerning journal article Materials and Corrosion Vol. 48 No. 5, (1997), (pp. 303-310).
9) Abstract and bibliographic information concerning journal article Platinum Metals Review (London) Vol. 36 No. 1, (1992), (pp. 14-25).
10) Abstract and bibliographic information concerning journal article Elektrokhimiya (Moskau) vol. 25 No. 2, (1991), (pp. 252-255).

(Continued)

*Primary Examiner*—Michael A Marcheschi
(74) *Attorney, Agent, or Firm*—Morgan Lewis & Bockius LLP

(57) ABSTRACT

A composition for chemical-mechanical planarization comprises periodic acid and an abrasive present in a combined amount sufficient to planarize a substrate surface having a feature thereon comprising a noble metal, noble metal alloy, noble metal oxide, or any combination thereof. In one embodiment, the periodic acid is present in an amount in a range of from about 0.05 to about 0.3 moles/kilogram, and the abrasive is present in an amount in a range of from about 0.2 to about 6 weight percent. In another embodiment, the composition further comprises a pH-adjusting agent present in an amount sufficient to cause the pH of the composition to be in a range of from about pH 5 to about pH 10, or of from about pH 1 to about pH 4. A method for planarizing a substrate surface having a feature thereon comprising at least one noble metal, noble metal alloy, or noble metal oxide, or a combination thereof, comprises providing a composition or slurry comprising periodic acid and an abrasive in a combined amount sufficient to planarize the substrate surface, and polishing the surface with the slurry. A substrate produced by such a method is also provided.

48 Claims, No Drawings

OTHER PUBLICATIONS

11) Abstract and bibliographic information concerning journal article Energy Science and Technology, (1995), (pp. 257-262).
12) Abstract and bibliographic information concerning journal article Journal of the Electrochemical Society vol. 141 No. 10, (Oct. 1994), (pp. 2659-2668).
13) Abstract and bibliographic information concerning journal article Kinetics and Catalysis vol. 35 No. 3, (May-Jun. 1994), (pp. 376-381).
14) Abstract and bibliographic information concerning journal article Journal of the Electrochemical Society vol. 140 No. 10, (Oct. 1993), (pp. 2857-2862).
15) Abstract and bibliographic information concerning journal article Journal of Vacuum Science and Technology vol. 9 No. 2, (Mar.-Apr. 1991), (pp. 457-464).
16) Abstract and bibliographic information concerning a report by Pacific Northwest Lab., (May 1992), (8 pages).
17) Abstract and bibliographic information concerning conference All-union conference on activation analysis and other radioanalytical methods V.2, (1987), (pp. 275 (247 pages)).
18) Abstract and bibliographic information concerning journal article Electrochemical Society 1989 Fall meeting vol. 89-2, (1990), (pp. 173 (1010 pages)).
19) Abstract and bibliographic information concerning journal article Journal of the Less-Common Metals vol. 161 No. 1, (Jun. 1996), (pp. L1-L4).
20) Abstract and bibliographic information concerning journal article Energy Science and Technology, (Oct. 1988), (pp. 345-348).
21) Abstract and bibliographic information concerning journal article Sov. Electrochem. vol. 23 No. 1, (Jul. 1987), (pp. 76-80).
22) Abstract and bibliographic information concerning journal article Sov. Electrochem. vol. 22 No. 7, (Jan. 1987), (pp. 891-897).
23) Abstract and bibliographic information concerning journal article Sov. Electrochem. vol. 22 No. 7, (Jan. 1987), (pp. 863-869).
24) Abstract and bibliographic information concerning Proceedings of the International Society of Electrochemistry 36th meeting, (1985), (pp. 11160-11161).
25) Abstract and bibliographic information concerning journal article The Electrochemical Society, (1986), (pp. 368-386).
26) Abstract and bibliographic information concerning journal article Prot. Met. vol. 27 No. 2, (Nov. 1986), (pp. 182-185).
27) Abstract and bibliographic information concerning a report by National Aeronautics and Space Administration, Lewis Research Center, (1986), (16 pages).
28) Abstract and bibliographic information concerning a report by Battelle Columbus Labs., Metals and Ceramics Information Center, (Jul. 1986), (772 pages).
29) Abstract and bibliographic information concerning a report by Sandia National Labs., (1986), (19 pages).
30) Abstract and bibliographic information concerning journal article J. Opt. Soc. Am. B: Opt. Phys. vol. 3 No. 5, (May 1986), (pp. 815-820).
31) Abstract and bibliographic information concerning journal article J. Vac. Sci. Technol., A vol. 3 No. 6, (Nov. 1985), (pp. 2532-2536).
32) Abstract and bibliographic information concerning journal article Mater. Sci. Eng. v. 88, (Apr. 1987), (pp. 227-231).
33) Abstract and bibliographic information concerning conference by Soc. For Biomaterials, (1983), (pp. 38).
34) Abstract and bibliographic information concerning journal article Engineering Index, Neue Huette v. 25 n. 7, (Jul. 1980), (pp. 269-273).
35) Abstract and bibliographic information concerning journal article Engineering Index, Prakt Metallogr v. 13 n. 5, (May 1976), (pp. 211-220).
36) Abstract and bibliographic information concerning journal article Engineering Index, Verres Refract v. 29 n. 2, (Mar.-Apr. 1975), (pp. 83-99).
37) Abstract and bibliographic information concerning journal article Journal of Power Sources vol. 8 No. 2-3, (Sep.-Oct. 1982), (pp. 301-309).
Results of Search by NERAC Inc., bearing date of Apr. 12, 1999 (6 pages) containing items BU-CI.
1) Abstract and bibliographic information concerning journal article Aerospace vol. 13 No. 7, (1962-1971), (pp. 37-42).
2) Abstract and bibliographic information concerning European Patent No. 634464, (Jan. 18, 1995).
3) Abstract and bibliographic information concerning Chinese Patent No. 1053926, (Aug. 21, 1991).
4) Abstract and bibliographic information concerning Japanese Patent No. 87247100, (Oct. 28, 1987).
5) Abstract and bibliographic information concerning Japanese Patent No. 8696087, (May 14, 1986).
6) Abstract and bibliographic information concerning German Patent No. 214139, (Oct. 3, 1984).
7) Abstract and bibliographic information concerning Japanese Patent No. 8239200, (Mar. 4, 1982).
8) Abstract and bibliographic information concerning journal article American Chemical Society, (1980), (pp. 33-39).
9) Abstract and bibliographic information concerning Russian Patent No. 355250, (Oct. 16, 1972).
10) Abstract and bibliographic information concerning journal article Philips Journal of Research vol. 49 No. 1-2, (1995), (pp. 23-46).
11) Abstract and bibliographic information concerning journal article Feingeraetetechnik (East Germany) vol. 20 No. 4, (Apr. 1971), (pp. 167-169).
12) Abstract and bibliographic information concerning U.S. Patent No. 5,637,028 (Jun. 10, 1997).
13) Abstract and bibliographic information concerning U.S. Patent No. 5,637,028 (Jun. 10, 1997).
14) Abstract and bibliographic information concerning Russian Patent No. 626106 (1979).
Results of Search by NERAC Inc., bearing date of May 14, 1999 (8 pages) containing items CJ-CX.
1) Abstract and bibliographic information concerning journal article Surface and Coatings Technology vol. 51 No. 1-3, (Apr. 15, 1999), (pp. 385-391).
2) Abstract and bibliographic information concerning journal article Journal of Vacuum Science and Technology vol. 9 No. 2, (Mar.-Apr. 1991), (pp. 601-608).
3) Abstract and bibliographic information concerning a report by Oak Ridge National Lab., (Oct. 1991), (24 pages).
4) Abstract and bibliographic information concerning journal article High Temp. vol. 25 No. 5, (Mar. 1988), (pp. 662-667).
5) Abstract and bibliographic information concerning journal article Journal of Vacuum Science & Technology vol. 16 No. 6, (Nov.-Dec. 1998), (pp. 3077-3081).
6) Abstract and bibliographic information concerning journal article Journal of the Japan Society of Precision Engineering vol. 62 No. 10 (Oct. 1996), (pp. 1484-1488).
7) Abstract and bibliographic information concerning journal article Journal of Vacuum Science & Technology vol. 8 No. 1, (Jan.-Feb. 1990), (pp. 441-444).
8) Abstract and bibliographic information concerning journal article of Geophysical Research vol. 92 No. B4, (Mar. 30, 1997), (pp. 641-648).
9) Abstract and bibliographic information concerning journal article Surface Science vol. 167 No. 2-3, (1986), (pp. 401-416).
10) Abstract and bibliographic information concerning journal article Fizika i Khimiya Obrabotki Materialov No. 6, (Nov.-Dec. 1977), (pp. 150-152).
11) Abstract and bibliographic information concerning journal article IBM Technical Disclosure Bulletin vol. 19, No. 7, (Dec. 1976), (pp. 2701).
12) Abstract and bibliographic information concerning journal article Journal of the Less-Common Metals vol. 34 No. 1, (Jan. 1974), (pp. 177-179).
13) Abstract and bibliographic information concerning journal article Journal of the Less-Common Metals vol. 31 No. 3, (Jun. 1973), (pp. 393-395).
14) Abstract and bibliographic information concerning journal article J. Chem. Phys. vol. 101 No. 7 (pp. 6289-6300), no date.
Bob Small and Cass Shang, "CMP Processes for Nobel Metals and Metal Oxides," (Dec. 6, 2000), (7 pages).
G. Beitel, et al., "CMP Processes for Nobel Metals and Nobel Metal Oxides," (Mar. 2, 2002), (6 pages).
R. F. Schnabel, et al., "Patterning of Noble Metal Electrodes and Oxygen Barriers by CMP," (Apr. 2000), (8 pages).
International Search Report PCT/US/02/27330, Dec. 2002.

* cited by examiner

COMPOSITIONS OF CHEMICAL MECHANICAL PLANARIZATION SLURRIES CONTACTING NOBLE-METAL-FEATURED SUBSTRATES

BACKGROUND

1. Field of the Invention

The present invention relates generally to compositions for chemical-mechanical planarization, and more particularly to compositions for chemical-mechanical planarization of substrates ("noble-metal-featured substrates") having surface features comprising noble metals, noble metal alloys, noble metal oxides, and combinations thereof, associated methods, and substrates produced by such methods.

2. Description of Related Art

Chemical-Mechanical Planarization (also referred to as Chemical-Mechanical Polishing), or CMP, is commonly used in the manufacture of semiconductor devices and denotes the process of removing material and forming a substantially planar surface before additional layers are deposited and/or additional patterning of the layers occurs. CMP processes have been extensively studied for use in semiconductor fabrication and constitute integral steps in many practical production environments. However, CMP of metals has been studied most extensively in connection with metals such as tungsten, copper, aluminum, tantalum, among others, as well as oxides, nitrides and alloys thereof See, for example, *Chemical Mechanical Planarization of Microelectronic Materials*, by J. M. Steigerwald, S. P. Murarka and R. J. Gutmann (John Wiley & Sons 1997), especially Chapters 5-8. In contrast, CMP of noble metals, including alloys and oxides thereof, is much less well studied. The term "noble metals" typically refers to less reactive metals such as gold, silver, platinum, iridium and other elements typically found in or near Group VIII of the periodic table.

Interest in noble metals, and the alloys and oxides thereof, is increasing as such materials are useful as electrode and barrier materials in the fabrication of some electronic devices such as Gigabit ($10^9$ bit) DRAMs (dynamic random access memories) and FeRAMs (ferroelectric random access memories). Worldwide efforts are underway to commercialize high dielectric constant and ferroelectric thin films for use in capacitive elements as would be applied, for example, in advanced DRAMs and FeRAMs. High dielectric constant materials such as $BaSrTiO_3$ (BST) can be used for forming capacitor dielectrics in submicron integrated circuits (e. g. in DRAM storage capacitors, coupling capacitors in general circuits, among other uses). Additionally, ferroelectric materials such as $PbZrTiO_3$ (PZT) and $SrBi_2Ti_2O_9$ that can store charge for extended periods of time can be employed in the fabrication of non-volatile FeRAM memory elements. The chemical properties of these (and other) high dielectric constant and ferroelectric materials typically require that they be used in conjunction with noble metals, noble metal oxides and/or noble metal alloys (including Pt, Ir, $IrO_2$, among others). Examples of the use of high dielectric constant and/or ferroelectric materials in semiconductor fabrication and in conjunction with noble metals, noble metal alloys, and noble metal oxides, can be found in the following U.S. Pat. Nos. 5,318,927; 5,527,423; 5,976,928; 6,169,305, and references cited therein.

Conventional patterning of noble metals, noble metal alloys, and noble metal oxides includes the use of dry etching processes. However, dry etching has several disadvantages including unfavorable taper angle, fence formation, and a tendency to produce residual particles leading to contamination. Some of these disadvantages of conventional dry etching are due to the predominantly physical rather than chemical mechanism for material removal. Physical removal of material is prone to the formation of unwanted structures at the edges of the structures, such as electrodes, being etched.

SUMMARY

The present invention provides compositions and processes for the chemical-mechanical planarization or polishing (CMP) of substrates having at least one surface feature or layer comprising a noble metal, a noble metal alloy, and/or a noble metal oxide, or any combination thereof (sometimes referred to herein as noble metal features or the like). Suitable noble metals, noble metal alloys, and/or noble metal oxides include metals from Group VIII of the periodic table and include in particular, Pt, Ir and $IrO_2$. Many of the noble-metal-containing substrate features contemplated are on the order of from about 300 Angstroms (A) to about 1000 A thick. The compositions and processes of the present invention are suitable for use in applications such as the polishing of these featured substrate surfaces at desirable polishing rates using standard CMP equipment. In such applications, a suitable polishing rate may be from about 300 Angstromns per minute (A/min) to about 2000 A/min, merely by way of example.

As used herein, the chemical-mechanical planarization or polishing of a substrate having a metal feature or layer on its surface refers to the polishing of the substrate surface until the metal feature or layer is substantially coplanar with surrounding material, such as surrounding dielectric material, on the substrate. That is, the polishing of the metal-featured substrate continues until any metal excess is sufficiently removed to provide a substantially uniform profile across the substrate surface. By way of example, suitable surface uniformity (typically measured using known wafer profiling techniques) is reflected by wafer-within-wafer non-uniformity (WWNU) values of less than about 12%, preferably from about 4% to about 6%, or wafer-to-wafer non-uniformity (WTWNU) values of less than about 5%, preferably about 3%. Typically, each fabrication lab has acceptable uniformity values for each CMP process it uses, and generally prefers lower WWNU values or WTWNU values that indicate greater surface uniformity.

Preferably, the selectivity of the CMP composition used in this planarization or polishing process is high (at least greater than 1:1) in terms of the removal of metal relative to the removal of surrounding material or dielectric, where suitable selectivity ranges or values depend very much on the type of surrounding material or dielectric. By way of example, suitable selectivity ratios (i.e., removal of metal to removal of surrounding material or dielectric) may be on the order of 100:1 for tetraethoxysilane (TEOS) and 20:1 for boron phosphorous silicate glass (BPSG), though suitable ratios may be higher or lower than these particular ratios.

Once the metal feature is substantially coplanar with surrounding material on the substrate surface, further polishing may take place. Preferably, the selectivity ratio of the CMP composition used in this further polishing process is close to 1:1, such that dishing and erosion of the metal feature and the surrounding material is avoided or minimized. Typically, each fabrication lab has standards of acceptable dishing and erosion for the polished wafers (typically measured using wafer profiling techniques), and generally prefers lower levels of dishing and erosion that indicate greater surface quality.

An exemplary embodiment of the present invention is a composition for chemical-mechanical planarization that comprises periodic acid and an abrasive, wherein the periodic acid and the abrasive are present in a combined amount that is sufficient to planarize a substrate surface having at least one feature or layer thereon comprising a noble metal, a noble metal alloy, a noble metal oxide, or any combination thereof. In an embodiment of the composition of the present invention, the periodic acid is present in an amount in a range of from about 0.05 to about 0.3 moles/kilogram, or preferably, from about 0.075 to about 0.175 moles/kilogram, and the abrasive is present in an amount in a range of from about 0.2 to about 6 weight percent, or preferably, from about 0.2 to about 4 weight percent.

The abrasive component of the composition may be an abrasive material having a Mohs hardness number of greater than about 6.5. For example, the abrasive may be one or more of alumina, silica, zirconia, spinel, zirconium nitride, and carbide. In an embodiment of the composition of the invention, the abrasive comprises alumina. By way of example, the alumina may be an alpha-alumina, a gamma-alumina, or a combination thereof.

In other embodiments, the composition or slurry comprises a pH-adjusting agent or titration agent in an amount sufficient to cause the pH level of the slurry to be in a desirable range. In various embodiments the pH range is from about pH 5 to about pH 10, preferably, from about pH 7 to about pH 9, or from about pH 1 to about pH 4, preferably from about pH 2 to about pH 3. Suitable pH-adjusting agents include one or more of a quaternary amine and an inorganic base, such as tetramethylammonium hydroxide, ammonium hydroxide, potassium hydroxide, and sodium hydroxide. In still another embodiment, the composition further comprises a suspension agent, which is preferably a surfactant.

An exemplary embodiment of a method of the present invention for planarizing a substrate surface having at least one feature or layer thereon comprising at least one noble metal, noble metal alloy, or noble metal oxide, or any combination thereof. The method comprises providing a composition or slurry comprising periodic acid and an abrasive present in a combined amount that is sufficient to planarize the substrate surface, and polishing the surface with the slurry. In an embodiment of the method, the periodic acid is present in an amount in a range of from about 0.05 to about 0.3 moles/kilogram, or preferably, from about 0.075 to about 0.175 moles/kilogram, and the abrasive is present in an amount in a range of from about 0.2 to about 6 weight percent, or preferably, from about 0.2 to about 4 weight percent. In another embodiment of the method of the invention, the abrasive comprises an abrasive material discussed above, for example, alumina, whether alpha-alumina, gamma-alumina, or a combination thereof. In other embodiments, the slurry comprises a pH-adjusting agent or titration agent, also as described above, such that the pH level of the slurry is in a desirable range.

Use of the compositions and processes of the present invention may reduce, minimize or eliminate imperfections, defects, corrosion, recession and/or erosion that might otherwise appear on the substrate surfaces. Merely by way of example, the compositions and processes of the present invention may be used to meet objectives such as providing metal-featured substrates, such as Ir— or $IrO_2$-featured substrates, that have a surface roughness of less than about 4 Å and that are substantially corrosion-free, or providing metal-featured substrates that have dishing and erosion values of much less than 1000 Å, such as less than about 500Å, for example, about 300Å.

The present invention further encompasses a substrate produced by the methods disclosed herein. According to various embodiments of the invention, the substrate is substantially planar following chemical-mechanical polishing, has a WWNU of less than about 12%, and/or has a WTWNU of less than about 5%.

DETAILED DESCRIPTION

Compositions, associated methods, and substrates produced by such methods, according to the present invention are set forth in this description. In the examples set forth below, all numerical values and ranges are approximate unless explicitly stated otherwise.

Ir Polishing Compositions

Composition A

A polishing composition (such as "Composition A") useful for polishing iridium pursuant to some embodiments of the present invention is comprised of an abrasive (typically an alumina) and periodic acid ($H_5IO_6$) in aqueous solution (advantageously in distilled or de-ionized water, referred to collectively herein as "DI" water). Periodic acid is capable of participating in a fairly complex group of chemical reactions. Periodic acid is a rather weak acid ($K_a \approx 5.1 \times 10^{-5}$) and a strong oxidizing agent under acidic conditions ($E° = 1.6$ V). Depending on the pH of the medium containing periodic acid, different reactive species can be called into play including $H_5IO_6$, $H^+$, $H_4IO_6^-$, $IO_4^-$, $H_3IO_6^{-2}$. During the short contact time in typical CMP processing, the primary periodic acid reaction is thought to be that represented below in Equation 1 (Eq. 1).

$$H_5IO_6 + 2e^- + 2H^+ = HIO_3 + 3H_2O \qquad \text{Eq. 1.}$$

The reaction represented in Equation 1 is believed to be the primary CMP reaction involving periodic acid, although additional or different reactions may participate within the scope of the present invention.

Various CMP compositions are described herein in terms of the reactants and other chemical components that are mixed or otherwise combined to form the desired CMP slurry. However, it is recognized that a complex set of chemical processes typically follows blending of the CMP components that may destroy or alter, entirely or in part, one or more of the blended components. The CMP solutions comprising some embodiments of the present invention are described herein in terms of the blended components, with the understanding that the chemical composition (or range of compositions) of the resulting CMP slurry is the necessary result of chemical processes occurring between and among the blended components under the conditions specified. Thus, descriptions herein of the components blended to form a CMP slurry are intended to encompass the chemical species resulting from such blending under the condition (or set of conditions) specified.

One example of component concentrations for Composition A is shown in the following Table I.

Composition A Component Concentration

TABLE I

| Typical Composition A | |
|---|---|
| Component | Component Concentration |
| Alumina Abrasive | 2 weight % ("wt %") |
| Periodic Acid | 0.1 mol/1 kg |
| DI Water | Remaining weight amount to obtain final desired amount of Composition A |

Thus, for example, a 10 kilogram mixture of Composition A may be prepared by combining 200 grams of an alumina (whether alpha-, gamma-, or a combination of alpha- and gamma-alumina) abrasive, 1 mole of periodic acid and the remaining of amount DI water. One form of alpha-alumina abrasive advantageously used in connection with some compositions herein is the commercial product "CR-30" manufactured by Baikowski Chimie Co. of Annecy Cedex 9, France. Other sources of alpha-alumina, as well as sources of gamma-alumina or alpha- and gamma-alumina, may also be utilized.

pH Ranges

Composition A typically has a pH range from about 1 to about 2.5, and favorably (in terms of performance), a pH of about 1.5.

Preparation

Generally, Composition A is prepared by adding the alumina abrasive (such as CR-30) to a container of DI water and subsequently adding the periodic acid ($H_5IO_6$). The composition is typically stirred continuously within the container during at least the time of the preparation of the composition.

CMP Process

A typical example of the mixing ratio, process, pH and removal rate associated with Composition A is set forth in Table A, in which "A/min" denotes Angstroms ($10^{-10}$ meter) of material removed per minute of processing.

Mixing Ratio, Process, pH and Removal Rate

TABLE A

| Mixing Ratio | Process | pH | Ir Removal Rate (A/min) |
|---|---|---|---|
| 2 wt % Alpha-Alumina Abrasive 0.1 mol/1 kg Periodic Acid DI Water | 4/0/50/51/150 | 1.5-2.5 | 288 |

In the example of Table A, the CMP process was carried out using an IPEC 472 polisher and employing a down force pressure of 4 psi, a back pressure of 0 psi, a table speed of 50 rpm, a carrier speed of 51 rpm, and a composition flow rate of 150 ml/min. A stacked pad of IC-1000 over a Suba IV was used as the polishing pad on the primary platen of the polisher, and a Polytex pad was used as the buff pad on the secondary platen of the polisher. Composition A was stirred thoroughly before and during its use.

When employed according to the process of Table A, Composition A provided an Ir removal rate of approximately 288 Angstroms per minute. Additionally, Composition A provided an Ir removal rate of approximately 375 Angstroms per minute when carried out according to the above-described process (as set forth in Table A) with one variation, namely, applying a higher down force pressure of 6 psi. Furthermore, Composition A provided an Ir removal rate of approximately 400 Angstroms per minute when carried out according to the process set forth in Table A with one variation, namely, applying a higher table speed of 70 rpm. Generally, high removal rates (in terms of the material targeted for removal) are preferred.

Ir Polishing Compositions Including Titration with TMAH

Composition B

Other Ir polishing compositions (such as "Composition B") pursuant to some embodiments of the present invention comprise an alumina abrasive (alpha-, gamma-, or both), periodic acid ($H_5IO_6$), DI water, and a pH-adjusting agent, or a base, typically tetramethylammonium hydroxide (TMAH). One example of component concentrations for Composition B is shown in Table II.

Composition B Component Concentration

TABLE II

| Typical Composition B | |
|---|---|
| Component | Component Concentration |
| Alpha-Alumina Abrasive | 2 wt % |
| Periodic Acid | 0.1 mol/kg |
| DI Water | Remaining weight amount to obtain final desired amount of Composition B |
| Tetramethylammonium Hydroxide (TMAH) | Titrate with TMAH to a pH of approximately between 6 and 7 |

By way of example, a 10 kilogram mixture of Composition B may be prepared by combining 200 grams of an alumina abrasive, 1 mole of periodic acid and the remaining amount of DI water. This mixture is then titrated with the titration agent TMAH to obtain a final pH of about 6 to about 7.

pH Ranges

Composition B typically has a pH range from about 6 to about 7 and, advantageously (in terms of performance), a pH of about 7.

Preparation

Generally, Composition B is prepared by adding the alumina abrasive to a container of DI water and subsequently adding the periodic acid ($H_5IO_6$). This mixture is then titrated with TMAH to obtain a final pH value of about 6 to about 7. Composition B is advantageously continuously stirred within the container during at least the period of composition preparation.

CMP Process

An example of the mixing ratio, process, pH and removal rate associated with Composition B is set forth in Table B.

Mixing Ratio, Process, pH and Removal Rate

TABLE B

| Mixing Ratio | Process | pH | Ir Removal Rate (A/min) |
|---|---|---|---|
| 2 wt % Alpha-Alumina Abrasive 0.1 mol/1 kg Periodic Acid DI Water Titrate with TMAH to a pH of approximately 7 | 4/0/50/51/150 | 6-7 | 325 |

In the example of Table B, the CMP process was carried out using an IPEC 472 polisher and employing a down force pressure of 4 psi, a back pressure of 0 psi, a table speed of 50 rpm, a carrier speed 51 rpm, and a composition flow rate of 150 ml/min. A stacked pad of IC-1000 over a Suba IV was used as the polishing pad on the primary platen, and a Polytex pad was used as the buff pad on the secondary platen. Composition B was stirred thoroughly before and during its use.

When employed according to the above-described process, Composition B provided an Ir removal rate of approximately 325 Angstroms per minute.

Ir Polishing Compositions Including Titration with NH$_4$OH

Composition C

Other Ir polishing compositions (such as "Composition C") pursuant to some embodiments of the present invention are comprised of an alumina (alpha-, gamma-, or both) abrasive, periodic acid (H$_5$IO$_6$), DI water, and a pH-adjusting agent or a base, such as ammonium hydroxide (NH$_4$OH). One example of component concentrations for Composition C is shown below in Table III.

Composition C Component Concentration

TABLE III

Typical Composition C

| Component | Component Concentration |
|---|---|
| Alpha-Alumina Abrasive | 2 wt % |
| Periodic Acid | 0.1 mol/1 kg |
| DI Water | Remaining weight amount to obtain final desired amount of Composition C |
| Ammonium Hydroxide (NH$_4$OH) | Titrate with NH$_4$OH to a pH of approximately 7 |

By way of example, 200 grams of an alumina abrasive, 1 mole of periodic acid and the remaining amount of DI water may be combined to provide a 10 kilogram mixture of Composition C. This mixture is then titrated with titration agent NH$_4$OH to obtain a final pH of about 6 to about 7.

pH Ranges

Composition C typically has a pH range from about 6 to about 7 and a favorable pH of about 7.

Preparation

Generally, Composition C is prepared by adding the alumina abrasive (such as CR-30) to a container of DI water and subsequently adding the periodic acid (H$_5$IO$_6$). This mixture is then titrated with the titration agent NH$_4$OH to obtain a final pH value of about 7. Composition C is advantageously stirred continuously within the container during at least the period of composition preparation.

CMP Process

An example of the mixing ratio, process, pH, removal rate and selectivity associated with Composition C is set forth in Table C.

Mixing Ratio, Process, pH, Removal Rate, and Selectivity

TABLE C

| Mixing Ratio | Process | pH | Ir Removal Rate (A/min) | Ir:TEOS Selectivity |
|---|---|---|---|---|
| 2 wt % Alpha-Alumina Abrasive 0.1 mol/1 kg Periodic Acid Remaining % DI Water Titrate with NH$_4$OH to a pH of approximately 7 | 5/0/90/ 50/150 | 6-7 | 360 | 1.8:1 |

In the example of Table C, the CMP process was carried out using an IPEC 472 polisher and employing a down force pressure of 5 psi, a back pressure of 0 psi, a table speed of 90 rpm, a carrier speed 50 rpm, and a composition flow rate of 150 ml/min. A stacked pad of IC-1000 over a Suba IV was used as the polishing pad on the primary platen, and a Polytex pad was used as the buff pad on the secondary platen. Composition C was stirred thoroughly before and during its use.

When employed according to the process of Table C, Composition C provided an Ir removal rate of approximately 360 Angstroms per minute. The Ir removal rates were compared with tetraethoxysilane (TEOS) removal rates, yielding a Ir:TEOS selectivity of 1.8:1. Generally speaking, high selectivity ratios (in terms of the material targeted for removal to another material) are preferred.

Composition D

According to some embodiments of the present invention, other Ir polishing compositions (such as "Composition D") are comprised of an alumina (alpha-, gamma-, or both) abrasive, periodic acid (H$_5$IO$_6$), DI water and a pH-adjusting agent or base such as ammonium hydroxide (NH$_4$OH). Illustrative component concentrations for Composition D are shown in the following Table IV.

Composition D Component Concentration

TABLE IV

Typical Composition D

| Component | Component Concentration |
|---|---|
| Alpha-Alumina Abrasive | 2 wt % |
| Periodic Acid | 0.1 mol/1 kg |
| DI Water | Remaining weight amount to obtain final desired amount of Composition D |
| Ammonium Hydroxide (NH$_4$OH) | Titrate with NH$_4$OH to a pH of approximately 3 |

By way of example, 200 grams of alumina abrasive, 1 mole of periodic acid and the remaining amount DI water may be combined to provide a 10 kilogram mixture of Composition D. This mixture is then titrated with titration agent NH$_4$OH to obtain a final pH of about 3.

pH Ranges

Composition D typically has a pH range from about 2 to about 4 and a favorable pH value of about 3.

Preparation

Generally, Composition D is prepared by adding the alumina abrasive (such as CR-30) to a container of DI water and subsequently adding the periodic acid (H$_5$IO$_6$). This mixture is then titrated with NH$_4$OH to obtain a final pH value of about 3. Composition D is favorably continuously stirred within the container during at least the time of composition preparation.

CMP Process

One example of the mixing ratio, process, pH, removal rate and IR:TEOS selectivity associated with Composition D is set forth in Table D.

Mixing Ratio, Process, pH, Removal Rate and Selectivity

TABLE D

| Mixing Ratio | Process | pH | Ir Removal Rate (A/min) | Ir:TEOS Selectivity |
|---|---|---|---|---|
| 2 wt % Alpha-Alumina Abrasive 0.1 mol/1 kg Periodic Acid Remaining % DI Water Titrate with NH$_4$OH to a pH of approximately 3 | 5/0/90/50/ 150 | 3-4 | 320 | 1:1.5 |

In the example set forth in Table D, the CMP process was carried out using an IPEC 472 polisher and employing a down force pressure of 5 psi, a back pressure of 0 psi, a table speed of 90 rpm, a carrier speed 50 rpm, and a composition flow rate of 150 ml/min. A stacked pad of IC-1000 over a Suba IV was used as the polishing pad on the primary platen, and a Polytex pad was used as the buff pad on the secondary platen. Composition D was stirred thoroughly before and during its use.

When employed according to the above-described process (as set forth in Table D), Composition D provided an Ir removal rate of approximately 320 Angstroms per minute. The Ir removal rates were compared with tetraethoxysilane (TEOS) removal rates, yielding a IR:TEOS selectivity of 1:1.5.

Ir Polishing Compositions including Suspension Agents

Other examples of Ir polishing compositions pursuant to some embodiments of the present invention comprise one or more agents for making an improved suspension. Typically such suspension-improving agents (hereinafter, "suspension agents") include abrasives.

Composition E

For example, some such Ir polishing compositions (such as "Composition E") comprise the components of Composition D and a second abrasive as a suspension agent. By way of example, in some such Ir polishing compositions the second abrasive may be Alumina-C as a 15% suspension. Alumina-C is a product, Aluminumoxid C (CAS#1344-28-1), of Deguss-Huls AG, which is used to keep the slurry in suspension for a suitable, and preferably long period. One example of component concentrations for Composition E is set forth in Table V.

Composition E Component Concentration

TABLE V

| Typical Composition E | |
|---|---|
| Component | Component Concentration |
| Alpha-Alumina Abrasive | 2 wt % |
| Periodic Acid | 0.1 mol/1 kg |
| DI Water | Remaining weight amount to obtain final desired amount of Composition E |
| Ammonium Hydroxide (NH$_4$OH) | Titrate with NH$_4$OH to a pH of approximately 3 |
| Alumina-C (15% suspension) | 0.9 wt % | pH Ranges

Composition E typically has a pH range from about 2 to about 4 and, advantageously, a pH of about 3.

Preparation

Generally, Composition E is prepared by adding the alpha-alumina abrasive (such as CR-30) to a container of DI water and subsequently adding the periodic acid (H$_5$IO$_6$). This mixture is then titrated with NH$_4$OH to obtain a final pH value of about 3. Finally, the second abrasive is added. Continuous stirring is maintained during at least the period of composition preparation.

CMP Process

An example of the mixing ratio, process, pH, removal rate and selectivity associated with Composition E is set forth in Table E.

Mixing Ratio, Process, pH, Removal Rate, and Selectivity

TABLE E

| Mixing Ratio | Process | pH | Ir Removal Rate (A/min) | Ir:TEOS Selectivity |
|---|---|---|---|---|
| 2 wt % Alpha-Alumina Abrasive 0.1 mol/1 kg Periodic Acid Remaining % DI Water Titrate with NH$_4$OH to a pH of approximately 3 0.9 wt % Second Abrasive (e.g., Alumina-C) | 5/0/90/ 50/150 | 3-4 | 260 | 1:2.2 |

In the example set forth in Table E, the CMP process was carried out using an IPEC 472 polisher and employing a down force pressure of 5 psi, a back pressure of 0 psi, a table speed of 90 rpm, a carrier speed of 50 rpm, and a composition flow rate of 150 ml/min. A stacked pad of IC-1000 over a Suba IV was used as polishing pad on the primary platen, and a Polytex pad was used as the buff pad on the secondary platen. Composition E was stirred thoroughly before and during its use.

When employed according to the process of Table E, Composition E provided an Ir removal rate of approximately 260 Angstroms per minute. The Ir removal rates were compared with tetraethoxysilane (TEOS) removal rates, yielding a IR:TEOS selectivity of 1:2.2.

Composition F

Other Ir polishing compositions (such as "Composition F") pursuant to the some embodiments of the present invention comprise the components of Composition C and a second abrasive as a suspension agent. In one such composition, a slurry suspension agent, Laponite (a product of Southwestern Clay Co. of Gonzales, Tex.) was used. Laponite is typically hydrous sodium lithium magnesium fluoro-silicate (Laponite B), hydrous sodium lithium magnesium silicate (Laponite D, RD, ED, HB, G, XLG), hydrous sodium lithium magnesium silicate modified with tetra sodium pyrophosphate (Laponite DS, RDS, XLS, S, JS, MS), or hydrous sodium lithium magnesium silicate treated to give a fluoride loading of 2000 ppm (Laponite DF). Although any of the types of Laponite can be used with comparable results, Laponite B was used in the example described below.

One example of component concentrations for Composition F is shown in Table VI.

Composition F Component Concentration

TABLE VI

| Typical Composition F | |
|---|---|
| Component | Component Concentration |
| Periodic Acid | 2.3 grams, or 0.1 mol/1 kg |
| DI Water | 76 grams |
| Ammonium Hydroxide (NH$_4$OH) | Titrate the above components with NH$_4$OH to a pH of approximately 7 |
| DI Water | 8 grams |
| Laponite (Second Abrasive) | 0.5 grams |
| Alpha-Alumina Abrasive (CR-30 @ 16 wt %) (First Abrasive) | 12.5 grams, or about 2 wt % |

Preparation

In one example, Composition F is prepared by combining an "Oxidizer A", described below, and an "Abrasive A", also described below. In the preparation of Oxidizer A, the periodic acid ($H_5IO_6$) is added to a container of DI water (76 grams). This mixture is then titrated with pH-adjusting agent or titration agent $NH_4OH$ to a final pH value of about 7. This resultant mixture is referred to herein as Oxidizer A. Abrasive A is prepared by adding the Laponite and the alumina abrasive to eight grams of DI water. Oxidizer A is added to Abrasive A to produce Composition F. Continuous stirring is maintained during at least the period of composition preparation.

Composition G

Other Ir polishing compositions (such as "Composition G") pursuant to some embodiments of the present invention comprise the components of Composition C and a slurry suspension agent, such as the surfactant Darvan C. Darvan C is a commercial ammonium polymethacrylate aqueous solution sold by R. T. Vanderbilt Company, Inc. of Norwalk, Conn.

One example of component concentrations for Composition G is set forth in Table VII.

Composition G Component Concentration

TABLE VII

Typical Composition G

| Component | Component Concentration |
|---|---|
| Periodic Acid | 2.3 grams, or 0.1 mol/1 kg |
| DI Water | 76 grams |
| Ammonium Hydroxide ($NH_4OH$) | Titrate the above components with $NH_4OH$ to a pH of approximately 7 |
| DI Water | 8 grams |
| Darvan C | 0.5 grams |
| Alpha-Alumina Abrasive (CR-30 @ 16 wt %) (First Abrasive) | 12.5 grams, or about 2 wt % |

Preparation

In one example, Composition G is prepared by combining Oxidizer A and "Abrasive B", as described below. Oxidizer A is prepared as previously described in relation to Composition F. Abrasive B is prepared by adding the Darvan C and the alumina abrasive to eight grams of DI water. Oxidizer A is added to Abrasive B to produce Composition G. Continuous stirring is maintained during the composition preparation.

Composition H

Other Ir polishing compositions (such as "Composition H") pursuant to some embodiments of the present invention comprise the components of Composition C and a second abrasive as a suspension agent. In some embodiments, the second abrasive is LUDOX TM-50. LUDOX TM-50 is a commercial colloidal silica abrasive of E. I. Du Pont de Nemours and Company, having advantageous properties in terms of particle size and contribution to composition suspension and stability.

One example of component concentrations for Composition H is set forth in Table VIII.

Composition H Component Concentration

TABLE VIII

Typical Composition H

| Component | Component Concentration |
|---|---|
| Periodic Acid | 2.3 grams, or 0.1 mol/1 kg |
| DI Water | 76 grams |
| Ammonium Hydroxide ($NH_4OH$) | Titrate the above components with $NH_4OH$ to a pH of approximately 7 |
| DI Water | 8 grams |
| LUDOX TM-50 (Second Abrasive) | 0.5 grams |
| Alpha-Alumina Abrasive (CR-30 @ 16 wt %) (First Abrasive) | 12.5 grams, or about 2 wt % |

Preparation

Generally, Composition H is prepared by combining Oxidizer A and "Abrasive C", as described below. Oxidizer A is prepared as previously described. Abrasive C is prepared by adding the LUDOX TM-50 (the second abrasive) and the alumina abrasive (the first abrasive) to eight grams of DI water. Oxidizer A is added to Abrasive C to produce Composition H. Continuous stirring is maintained during at least the composition preparation.

Composition I

Other Ir polishing compositions (such as "Composition I") pursuant to some embodiments of the present invention comprise the components of Composition C and a slurry suspension agent. In some embodiments, the suspension agent is ethyl carbonate. One example of component concentrations for Composition I is set forth in Table IX.

Composition I Component Concentration

TABLE IX

Typical Composition I

| Component | Component Concentration |
|---|---|
| Periodic Acid | 2.3 grams, or 0.1 mol/1 kg |
| DI Water | 76 grams |
| Ammonium Hydroxide ($NH_4OH$) | Titrate the above components with $NH_4OH$ to a pH of approximately 7 |
| DI Water | 8 grams |
| Ethyl Carbonate | 0.5 grams |
| Alpha-Alumina Abrasive (CR-30 @ 16 wt %) | 12.5 grams, or about 2 wt % |

Preparation

In one example, Composition I is prepared by combining Oxidizer A and "Abrasive D", as described below. Ozidizer A is prepared as previously described. Abrasive D is prepared by adding the ethyl carbonate and the alumina abrasive to eight grams of DI water. Oxidizer A is added to Abrasive D to produce Composition I. Continuous stirring is maintained during the composition preparation.

Composition J

Other Ir polishing compositions (such as "Composition J") pursuant to some embodiments of the present invention comprise the components of Composition C and an organic acid as a suspension agent. In one embodiment, the organic acid is succinic acid. In other embodiments, alternative water soluble organic acids (e.g. mono-, di-, and tri-functional acids) can be used, as can other suspension agents or surfactants that act to suspend the abrasive. One example of component concentrations for Composition J is set forth in Table X.

Composition J Component Concentration

TABLE X

Typical Composition J

| Component | Component Concentration |
|---|---|
| Periodic Acid | 2.3 grams, or 0.1 mol/1 kg |
| DI Water | 76 grams |
| Ammonium Hydroxide (NH₄OH) | Titrate the above components with NH₄OH to a pH of approximately 7 |
| DI Water | 7.5 grams |
| Succinic acid | 1.0 grams |
| Alpha-Alumina Abrasive (CR-30 @ 16 wt %) | 12.5 grams, or about 2 wt % |

Preparation

In one example, Composition J is prepared by combining Oxidizer A and "Abrasive E". Oxidizer A is prepared as previously described. Abrasive E is prepared by adding the succinic acid (as an exemplary organic acid) and the alumina abrasive to 7.5 grams of DI water. Oxidizer A is added to Abrasive E to produce Composition J. Continuous stirring is maintained during the composition preparation.

Composition K

Other Ir polishing compositions (such as "Composition K") pursuant to the present invention comprise the components of Composition C and a second abrasive as a suspension agent. In some embodiments, the second abrasive is an alumina abrasive in the form of "CR-140". Cr-140 is a commercial abrasive product manufactured by Baikowski Chimie Co. of Annecy Cedex 9, France, believed to comprise about 95% gamma-alumina and about 5% alpha-alumina. One example of component concentrations for Composition K is set forth in the Table XI.

Composition K Component Concentration

TABLE XI

Typical Composition K

| Component | Component Concentration |
|---|---|
| Periodic Acid | 2.3 grams, or 0.1 mol/1 kg |
| DI Water | 76 grams |
| Ammonium Hydroxide (NH₄OH) | Titrate the above components with NH₄OH to a pH of approximately 7 |
| DI water | 3.5 grams |
| CR-140 @ 20 wt % (Second Abrasive) | 5.0 grams |
| Alpha-Alumina Abrasive (CR-30 @ 16 wt %) (First Abrasive) | 12.5 grams, or about 2 wt % |

Preparation

In one example, Composition K is prepared by combining Oxidizer A (prepared as previously described) and "Abrasive F". Abrasive F is prepared by adding CR-140 (the second abrasive) and CR-30 (the first abrasive) to 3.5 grams of DI water. Oxidizer A is added to Abrasive F to produce Composition K. Continuous stirring is maintained during the composition preparation.

Preparation conditions associated with Compositions F through K are set forth below in Table 1.

Compositions F Through K Preparation Conditions

TABLE 1

| Composition | DI Water | Second Abrasive | First Abrasive | Stir Time | Oxidizer | Stir Time |
|---|---|---|---|---|---|---|
| Composition F | 8 grams | 0.5 grams Laponite | 12.5 grams, or about 2 wt % | 2 hours | 79 grams of Oxidizer A | >20 min. |
| Composition G | 8 grams | 0.5 grams Darvan C | 12.5 grams, or about 2 wt % | 2 hours | 79 grams of Oxidizer A | >20 min. |
| Composition H | 8 grams | 0.5 grams LUDOX TM-50 | 12.5 grams, or about 2 wt % | 2 hours | 79 grams of Oxidizer A | >20 min. |
| Composition I | 8 grams | 0.5 grams Ethyl Carbonate | 12.5 grams, or about 2 wt % | 2 hours | 79 grams of Oxidizer A | >20 min. |
| Composition J | 7.5 grams | 1.0 grams Succinic acid | 12.5 grams, or about 2 wt % | 2 hours | 79 grams of Oxidizer A | >20 min. |
| Composition K | 3.5 grams | 5 grams CR-140 (20% wt) | 12.5 grams, or about 2 wt % | 2 hours | 79 grams of Oxidizer A | >20 min. |

Table 2 below sets forth the pH, settling time, Ir removal rate and Ir:TEOS selectivity associated with Compositions F through K. As used herein, settling time refers to the time it takes for a homogenous slurry mixture to settle in an ambient environment so that a clear top layer is formed. In these examples, the unit of measure for settling time is millimeters of clear liquid (i.e., the depth of the clear top layer measured from the top of the original homogenous mixture) in a given unit of time. For instance, a settling time of 9 mm/10 min indicates that a 9 mm deep layer of clear liquid was formed after 10 minutes of standing in an ambient environment. Generally, a suitable slurry, such as any of the examples of Compositions F through K, should not settle in a relatively "hard" or packed manner such that the slurry can't be resuspended with minimal agitation.

For Ir polishing, Composition H is preferred in view of its favorable Ir removal rate of 240 A/min, and more particularly, its favorable 3.9:1 Ir:TEOS selectivity, which relatively high selectivity is believed to play an important role at the end of the polishing step.

pH, Settling Time, Ir Removal Rate and Selectivity for Compositions F Through K

TABLE 2

| Composition | pH | Settling Time (mm/min) | Ir Removal Rate (A/min) | Ir:TEOS Selectivity |
|---|---|---|---|---|
| Composition F | 7.3 | 9 mm/10 min | 240 | 2.7:1 |
| Composition G | 7.3 | 9 mm/10 min | 340 | 2.1:1 |
| Composition H | 7.3 | 9 mm/10 min | 240 | 3.9:1 |
| Composition I | 7.3 | 9 mm/10 min | 350 | 2.3:1 |
| Composition J | 6.7 | 5 mm/2 hrs | 80 | 1:1.3 |
| Composition K | 6.9 | 10 mm/10 min | 230 | 3.4:1 |

Each of the CMP processes set forth in Table 2 above was carried out using an IPEC 576 polisher with a Thomas West XY pad and employing a down force pressure of 4 psi, a back pressure of 0 psi, a table or platen speed of 200 rpm, a carrier speed of 18 rpm, and a composition flow rate of 150 ml/min. Compositions F through K were stirred thoroughly before and during their use.

$IrO_2$ Polishing Compositions

Composition L (for polishing $IrO_2$)

Iridium oxide ($IrO_2$) polishing compositions (such as "Composition L") pursuant to some embodiments of the present invention comprise an alumina (alpha-, gamma-, or both) abrasive, hydrazine hydrate ($NH_2$—$NH_2.H_2O$), and DI water. Hydrazine hydrate is believed to contribute to the polishing of the noble metal oxide. Further, it is believed that the caustic hydrazine hydrate may also serve as a reducing agent, although this effect may be slight or minimal. According to the present invention, an $IrO_2$ polishing composition should have a pH of from about pH 5 to about pH 10, perferably, from about pH 7 to about pH 9. An example of component concentrations for Composition L is set forth below in Table XII.

Composition L Component Concentration

TABLE XII

| Typical Composition L | |
|---|---|
| Component | Component Concentration |
| Alpha-Alumina Abrasive (CR-30) | 2 wt % |
| Hydrazine hydrate | 0.1 mol/1 kg |
| DI Water | Remaining weight amount to obtain final desired amount of Composition L | pH Ranges

Composition L typically has pH level of pH 8 or greater, such as from about pH 8 to about pH 10 and, advantageously, from about pH 9 to about pH 9.5.

Preparation

Generally, Composition L is prepared by adding the alumina abrasive (such as CR-30) to a container of DI water and subsequently adding the hydrazine hydrate. Composition L is typically continuously stirred within the container during at least the period of composition preparation.

CMP Process

An example of the mixing ratio, process, pH and removal rate associated with Composition L is set forth below in Table L.

Mixing Ratio, Process, pH and Removal Rate

TABLE L

| Mixing Ratio | Process | pH | $IrO_2$ Removal Rate (A/min) |
|---|---|---|---|
| 2 wt % Alpha-Alumina Abrasive 0.1 mol/1 kg Hydrazine hydrate DI Water | 4/0/50/51/150 | 9–9.5 | 880 |

In the example set forth in Table L, the CMP process was carried out using an IPEC 472 polisher and employing a down force pressure of 4 psi, a back pressure of 0 psi, a table speed of 50 rpm, a carrier speed 51 rpm, and a composition flow rate of 150 ml/min. A stacked pad of IC-1000 over a Suba IV was used as the polishing pad on the primary platen of the polisher, and a Polytex pad was used as buff pad on the secondary platen of the polisher. Composition L was stirred thoroughly before and during its use.

When employed according to the process set forth in Table L, Composition L provided an $IrO_2$ removal rate of approximately 880 Angstroms per minute.

Another example of component concentrations for Composition L (denoted as "Composition L(a)") is shown below in Table XIIa.

Composition L(a) Component Concentration

TABLE XIIa

| Typical Composition L(a) (additional embodiments) | |
|---|---|
| Component | Component Concentration |
| Alpha-Alumina Abrasive (CR-30) | 2 wt % |
| Hydrazine hydrate | 0.05 mol/kg |
| DI Water | Remaining weight amount to obtain final desired amount of Composition L | pH Ranges

The example of Table XIIa has a favorable pH value of about 9.

CMP Process

An example of the mixing ratio, process, pH and removal rate associated with Composition L(a) is set forth below in Table L(a).

Mixing Ratio, Process, pH and Removal Rate

TABLE L(a)

| Mixing Ratio | Process | pH | $IrO_2$ Removal Rate (A/min) |
|---|---|---|---|
| 2 wt % Alpha-Alumina Abrasive 0.05 mol/1 kg Hydrazine hydrate DI Water | 4/0/50/51/150 | 9 | 740 |

In the example set forth in Table L(a), the CMP process was carried out using an IPEC 472 polisher and employing a down force pressure of 4 psi, a back pressure of 0 psi, a table speed of 50 rpm, a carrier speed of 51 rpm, and a composition flow rate of 150 ml/min. A stacked pad of IC-1000 over a Suba IV was used as the polishing pad on the primary platen of the polisher, and a Polytex pad was used as buff pad on the secondary platen of the polisher. The above Composition L(a) was stirred thoroughly before and during its use.

When employed according to the process of Table L(a), Composition L(a) provided an $IrO_2$ removal rate of approximately 740 Angstroms per minute.

Composition M (for polishing $IrO_2$)

Other iridium oxide ($IrO_2$) polishing compositions (such as "Composition M") pursuant to some embodiments of the present invention are comprised of an alumina (alpha-, gamma-, or both) abrasive, tetramethylammonium hydroxide (TMAH), and DI water. TMAH is believed to contribute to the polishing of the noble metal oxide. An example of component concentrations for Composition M is set forth below in Table XIII.

Composition M Component Concentration

TABLE XIII

Typical Composition M

| Component | Component Concentration |
|---|---|
| Alpha-Alumina Abrasive (CR-30) | 2 wt % |
| Tetramethylammonium Hydroxide | 0.1 mol/1 kg |
| DI Water | Remaining weight amount to obtain final desired amount of Composition M | pH Ranges

Composition M typically has a pH level of pH 8 or greater, such as in a range from about pH 9 to about pH 11 and, favorably, of about pH 10.

Preparation

Generally, Composition M is prepared by adding the alpha-alumina abrasive (CR-30) to a container of DI water and subsequently adding tetramethylammonium hydroxide (TMAH). Composition M is preferably continuously stirred within the container during at least the composition preparation.

CMP Process

An example of the mixing ratio, process, pH and removal rate associated with Composition M is set forth below in Table M. For $IrO_2$ polishing, Composition M is preferred in view of its favorable $IrO_2$ removal rate of 635 A/min.

Mixing Ratio, Process, pH and Removal Rate

TABLE M

| Mixing Ratio | Process | pH | $IrO_2$ Removal Rate (A/min) |
|---|---|---|---|
| 2 wt % Alpha-Alumina Abrasive 0.1 mol/kg Tetramethylammonium Hydroxide DI Water | 4/0/50/51/150 | 10 | 635 |

In the example set forth in Table M, the CMP process was carried out using an IPEC 472 polisher and employing a down force pressure of 4 psi, a back pressure of 0 psi, a table speed of 50 rpm, a carrier speed of 51 rpm, and a composition flow rate of 150 ml/min. A stacked pad of IC-1000 over a Suba IV was used as the polishing pad on the primary platen of the polisher, and a Polytex pad was used as buff pad on the secondary platen of the polisher. The Composition M of the example was stirred thoroughly before and during its use.

When employed according to the above process, Composition M provided an $IrO_2$ removal rate of approximately 635 Angstroms per minute.

Another example of component concentrations for Composition M (denoted herein as "Composition M(a)") is set forth below in Table XIIIa.

Composition M(a) Component Concentration

TABLE XIIIa

Typical Composition M(a)

| Component | Component Concentration |
|---|---|
| Alpha-Alumina Abrasive (CR-30) | 2 wt % |
| Tetramethylammonium Hydroxide | 0.03 mol/1 kg |
| DI Water | Remaining weight amount to obtain final desired amount of Composition M | pH Ranges

Composition M(a) has an advantageous pH range from about 9 to about 10.

CMP Process

An example of the mixing ratio, process, pH and removal rate for Composition M(a) is set forth below in Table M(a).

Mixing Ratio, Process and Removal Rate

TABLE M(a)

| Mixing Ratio | Process | pH | $IrO_2$ Removal Rate (A/min) |
|---|---|---|---|
| 2 wt % Alpha-Alumina Abrasive 0.03 mol/kg Tetramethylammonium Hydroxide DI water | 4/0/50/51/150 | 9–10 | 320 |

In the example set forth in Table M(a), the CMP process was carried out using an IPEC 472 polisher and employing a down force pressure of 4 psi, a back pressure of 0 psi, a table speed of 50 rpm, a carrier speed of 51 rpm, and a composition flow rate of 150 ml/min. A stacked pad of IC-1000 over a Suba IV was used as the polishing pad on the primary platen of the polisher, and a Polytex pad was used as buff pad on the secondary platen of the polisher. The Composition M(a) of this example was stirred thoroughly before and during its use.

When employed according to the process of Table M(a), Composition M(a) provided an $IrO_2$ removal rate of approximately 320 Angstroms per minute.

Platinum (Pt) Polishing Compositions

Composition N

Platinum (Pt) polishing compositions (such as "Composition N") pursuant to some embodiments of the present invention comprise an alumina abrasive (alpha-, gamma-, or both), periodic acid ($H_5IO_6$), and DI water. Thus, Composition N is comprised of the same components as Composition A. An example of component concentrations for Composition N is set forth below in Table XIV.

Composition N Component Concentration

TABLE XIV

| Typical Composition N | |
| --- | --- |
| Component | Component Concentration |
| Alpha-Alumina Abrasive (CR-30) | 2 wt % |
| Periodic Acid | 0.1 mol/1 kg |
| DI Water | Remaining weight amount to obtain final desired amount of Composition N | pH Ranges

Composition N advantageously has a pH value of about 1.6.

Preparation

Generally, Composition N is prepared by adding water the alumina abrasive (such as CR-30) to a container of DI and subsequently adding the periodic acid ($H_5IO_6$). Composition N is advantageously stirred continuously within the container during at least the period of composition preparation.

CMP Process

An example of the mixing ratio, process, pH, removal rates and selectivity associated with Composition N is set forth in Table N.

Mixing Ratio, Process, pH, Removal Rates, and Selectivity

TABLE N

| Mixing Ratio | Process | pH | Removal Rate (A/min) Pt | Removal Rate (A/min) BPSG | Pt:BPSG Selectivity |
| --- | --- | --- | --- | --- | --- |
| 2 wt % Alpha-Alumina Abrasive 0.1 mol/1 kg Periodic Acid DI water | 2/200/18/150 | 1.6 | 131 | 180 | 1:1.5 |

In the example set forth in Table N, the CMP process was carried out using an IPEC 576 polisher with a Thomas West XY pad and employing a down force pressure of 2 psi, a table or platen speed of 200 rpm, a carrier speed of 18 rpm, and a composition flow rate of 150 ml/min. Composition N was stirred thoroughly before and during its use.

When employed according to the process of Table N, Composition N provides a Pt removal rate of 131 A/min and a Boron Phosphorous Silicate Glass (BPSG) removal rate of 180 A/min, demonstrating a Pt:BPSG selectivity of 1:1.5.

Composition O

Other platinum polishing compositions (such as "Composition O") pursuant to some embodiments of the present invention comprise an alumina (alpha-, gamma-, or both) abrasive, periodic acid (H5IO6), ammonium chloride (NH4Cl), and DI water. It is believed that the electrolyte, ammonium chloride, serves as a source of chloride ions that assist in metal etching. One example of component concentrations for Composition O is set forth below in Table XV.

Composition O Component Concentration

TABLE XV

| Typical Composition O | |
| --- | --- |
| Component | Component Concentration |
| Alpha-Alumina Abrasive (CR-30) | 2 wt % |
| Periodic Acid | 0.1 mol/1 kg |
| Ammonium Chloride | 0.1 mol/1 kg |
| DI Water | Remaining weight amount to obtain final desired amount of Composition O | pH Ranges

Composition O typically has a pH range from about 1.2 to about 1.8 and a favorable pH value of about 1.6.

Preparation

Generally, Composition O is prepared by adding the alumina abrasive (such as CR-30) to a container of DI water, then adding the periodic acid ($H_5IO_6$), and then adding the ammonium chloride. Composition O is advantageously stirred continuously within the container during the composition preparation.

CMP Process

An example of the mixing ratio, process, pH, removal rates and selectivity for Composition O is set forth below in Table O.

Mixing Ratio, Process, pH, Removal Rates and Selectivity

TABLE O

| Mixing Ratio | Process | pH | Pt Removal Rate (A/min) | Removal Rate (A/min) BPSG | Pt:BPSG Selectivity |
| --- | --- | --- | --- | --- | --- |
| 2 wt % Alpha-Alumina Abrasive 0.1 mol/kg Periodic Acid 0.1 mol/kg Ammonium Chloride DI Water | 2/200/18/150 | 1.6 | 443 | 56 | 8:1 |

The CMP process of Table O for Composition O was carried out using an IPEC 576 polisher with a Thomas West XY pad and employing a down force pressure of 2 psi, a table or platen speed of 200 rpm, a carrier speed of 18 rpm, and a composition flow rate of 150 ml/min. Composition O was stirred thoroughly before and during its use.

Composition O, when employed according to the process of Table O, Composition O provides a Pt removal rate of 443 A/min and a BPSG removal rate of 56 A/min, demonstrating a Pt:BPSG selectivity of 8:1.

Composition P

Other platinum polishing compositions (such as "Composition P") pursuant to some embodiments of the present invention comprise an alumina (alpha-, gamma-, or both) abrasive, periodic acid ($H_5IO_6$), ammonium chloride ($NH_4Cl$), and DI water. One example of component concentrations for Composition P is set forth below in Table XVI.

Composition P Component Concentration

TABLE XVI

Typical Composition P

| Component | Component Concentration |
|---|---|
| Alpha-Alumina Abrasive (CR-30) | 6 wt % |
| Periodic Acid | 0.1 mol/1 kg |
| Ammonium Chloride | 0.1 wt % |
| DI Water | Remaining weight amount to obtain final desired amount of Composition P | pH Ranges

Composition P advantageously has a pH range from about 1.5 to about 2.

Preparation

Generally, Composition P is prepared by adding the alumina abrasive (such as CR-30) to a container of DI water, then adding the periodic acid ($H_5IO_6$), and then adding the ammonium chloride ($NH_4Cl$). Composition P is favorably continuously stirred within the container during at least the composition preparation.

CMP Processes

Several examples of the processes and removal rates for Composition P are set forth below in Table P.

Processes and Removal Rates

TABLE P

| Process | Pt Removal Rate (A/min) |
|---|---|
| 2/200/18/70 | 220 |
| 4/200/18/70 | 470 |
| 6/200/18/70 | 750 |
| 7/200/18/70 | 1,020 |

The CMP processes set forth in Table P were carried out using an IPEC 576 polisher with a Thomas West XY pad and employing a down force pressure of 2 psi, 4 psi, 6 psi and 7 psi, respectively. All processes further employed a table or platen speed of 200 rpm, a carrier speed of 18 rpm, and a composition flow rate of 70 ml/min. Composition P was stirred thoroughly before and during its use.

When employed according to the processes set forth in Table P, Composition provides Pt removal rates of 220 A/min, 470 A/min, 750 A/min, and 1,020 A/min, respectively.

Composition Q

Other platinum polishing compositions (such as "Composition Q") pursuant to some embodiments of the present invention comprise an alumina abrasive (alpha-, gamma-, or both), ammonium chloride (NH4Cl), and DI water. One example of component concentrations for Composition P is set forth below in Table XVII.

Composition Q Component Concentration

TABLE XVII

Typical Composition Q

| Component | Component Concentration |
|---|---|
| Alpha-Alumina Abrasive (CR-30) | 2 wt % |
| Ammonium Chloride | 0.1 mol/1 kg |
| DI Water | Remaining weight amount to obtain final desired amount of Composition Q | pH Ranges

The present Composition Q advantageously has a general pH range from about 5 to about 6 and a favorable pH of about 5.4.

Preparation

Generally, Composition Q is prepared by adding the alumina abrasive (such as CR-30) to a container of DI water and then adding the ammonium chloride. Composition Q is typically stirred continuously within the container during the composition preparation.

CMP Process

An example of the mixing ratio, process, pH, removal rates and selectivity associated with Composition Q is set forth below in Table Q. For Pt polishing, Composition Q is preferred in view of its favorable Pt removal rate of 1598 A/min and its favorable Pt:BPSG selectivity of 11:1.

Mixing Ratio, Process, pH, Removal Rates and Selectivity

TABLE Q

| Mixing Ratio | Process | pH | Pt Removal Rate (A/min) | Removal Rate (A/min) BPSG | Pt:BPSG Selectivity |
|---|---|---|---|---|---|
| 2 wt % Alpha-Alumina Abrasive 0.1 mol/kg Ammonium Chloride DI Water | 2/0/200/ 18/150 | 5.4 | 1598 | 145 | 11:1 |

The CMP process set forth in Table Q was carried out using an IPEC 576 polisher with a Thomas West XY pad and employing a down force pressure of 2 psi, a back pressure of 0 psi, a table or platen speed of 200 rpm, a carrier speed of 18 rpm, and a composition flow rate of 150 ml/min. Composition Q is advantageously stirred thoroughly before and during its use.

When employed according to the process of Table Q, Composition Q provides a Pt removal rate of 1,598 A/min and a BPSG removal rate of 145 A/min, demonstrating a Pt:BPSG selectivity of approximately 11:1.

Composition R

Other Pt polishing compositions (such as "Composition R") pursuant to some embodiments of the present invention comprise an alumina (alpha-, gamma-, or both) abrasive, hydrochloric acid (HCl) and DI water. It is believed that the hydrochloric acid serves as a source of chloride ions that assist in the etching of metal. One example of component concentrations for Composition R is set forth below in Table XVIII.

Composition R Component Concentration

TABLE XVIII

| Typical Composition R | |
|---|---|
| Component | Component Concentration |
| Alpha-Alumina Abrasive (CR-30) | 2 wt % |
| Hydrochloric Acid | 0.1 mol/kg |
| DI Water | Remaining weight amount to obtain final desired amount of Composition R | pH Ranges

Composition R typically has a pH range from about 1.0 to about 2.0 and a favorable pH of about 1.2.

Preparation

Generally, Composition R is prepared by adding the alumina abrasive (CR-30) to a container of DI water and subsequently adding the hydrochloric acid. Composition R is favorably continuously stirred within the container during at least the composition preparation.

CMP Process

An example of the mixing ratio, process, pH, removal rates and selectivity for Composition R is set forth below in Table R.

Mixing Ratio, Process, pH, Removal Rates and Selectivity

TABLE R

| Mixing Ratio | Process | pH | Pt Removal Rate (A/min) | BPSG Removal Rate (A/min) | Pt:BPSG Selectivity |
|---|---|---|---|---|---|
| 2 wt % Alpha-Alumina Abrasive 0.1 mol/kg Hydrochloric Acid DI Water | 2/0/200/18 | 1.2 | 334 | 26 | 13:1 |

CMP Processes:

The CMP process for Composition R of Table R was carried out using an IPEC 576 polisher with a Thomas West XY pad and employing a down force pressure of 2 psi, a back pressure of 0 psi, a table or platen speed of 200 rpm, a carrier speed of 18 rpm, and a composition flow rate of 150 ml/min. Composition R was stirred thoroughly before and during its use.

When employed according to the process of Table R, Composition R provides a Pt removal rate of 334 A/min and a BPSG removal rate of 26 A/min, demonstrating a Pt:BPSG selectivity of 13:1.

Composition S

Other Pt polishing compositions (such as "Composition S") pursuant to some embodiments of the present invention comprise an alumina (alpha-, gamma-, or both) abrasive, hydrochloric acid (HCl), ammonium chloride ($NH_4Cl$), and DI water. One example of component concentrations for Composition S is set forth below in Table XIX.

Composition S Component Concentration

TABLE XIX

| Typical Compositions | |
|---|---|
| Component | Component Concentration |
| Alpha-Alumina Abrasive (CR-30) | 2 wt % |
| Hydrochloric acid | 0.1 mol/1 kg |
| Ammonium Chloride | 0.1 mol/1 kg |
| DI Water | Remaining weight amount to obtain final desired amount of Composition S | pH Ranges

Composition S typically has a pH range from about 1 to about 2 and, favorably, a pH of about 1.4.

Preparation

Generally, Composition S is prepared by adding the alumina abrasive (such as CR-30) to a container of DI water, then adding the hydrochloric acid, and then adding the ammonium chloride ($NH_4Cl$). Composition S is advantageously stirred continuously within the container during at least the composition preparation.

CMP Process

An example of the mixing ratio, process, pH and removal rate for Composition S is set forth in Table S.

Mixing Ratio, Process and Removal Rate

TABLE S

| Mixing Ratio | Process | pH | Pt Removal Rate (A/min) |
|---|---|---|---|
| 2 wt % Alpha-Alumina Abrasive 0.1 mol/1 kg Hydrochloric acid 0.1 mol/1 kg Ammonium Chloride DI Water | 4/0/200/18/70 | 1.4 | 310 |

The CMP process set forth in Table S was carried out using an IPEC 576 polisher with a Thomas West XY pad and employing a down force pressure of 4 psi, a back pressure of 0 psi, a table or platen speed of 200 rpm, a carrier speed of 18 rpm, and a composition flow rate of 70 ml/min. Composition S was stirred thoroughly before and during its use.

When employed according to the process set forth in Table S, Composition S provides a Pt removal rate of 310 A/min.

Composition T

Other platinum polishing compositions (such as "Composition T") pursuant to some embodiments of the present invention comprise an alumina (alpha-, gamma-, or both) abrasive, hydroxylamine (HDA), and DI water. It is believed that the caustic HDA serves as a mild reducing agent. An example of component concentrations for Composition T is set forth below in Table XX.

Composition T Component Concentration

TABLE XX

| Typical Composition T | |
|---|---|
| Component | Component Concentration |
| Alpha-Alumina Abrasive (CR-30) | 2 wt % |
| Hydroxylamine | 0.1 mol/1 kg |

TABLE XX-continued

| Typical Composition T | |
|---|---|
| Component | Component Concentration |
| DI Water | Remaining weight amount to obtain final desired amount of Composition T | pH Ranges

Composition T typically has a pH range from about 8 to about 9 and advantageously a pH of about 8.5.

Preparation

Generally, Composition T is prepared by adding the alumina abrasive (such as CR-30) to a container of DI water and then adding the hydroxylamine. Composition T is advantageously stirred continuously within the container during the composition preparation.

CMP Process

An example of the mixing ratio, process, pH, removal rates and selectivity for Composition T is set forth below in Table T.

Mixing Ratio, Process, pH, Removal Rates and Selectivity

TABLE T

| Mixing Ratio | Process | pH | Removal Rate (A/min) Pt | Removal Rate (A/min) BPSG | Pt:BPSG Selectivity |
|---|---|---|---|---|---|
| 2 wt % Alpha-Alumina Abrasive 0.1 mol/kg Hydroxylamine DI water | 4/0/50/51/150 | 8.5 | 209 | 432 | 1:2 |

In the example set forth in Table T, the CMP process was carried out using an IPEC 472 polisher and employing a down force pressure of 4 psi, a back pressure of 0 psi, a table speed of 50 rpm, a carrier speed 51 rpm, and a composition flow rate of 150 ml/min. An IC-1000 k-grooved pad was used as the polishing pad on the primary platen of the polisher, and a Polytex pad was used as buff pad on the secondary platen of the polisher. Composition T was stirred thoroughly before and during its use.

When employed according to the process of Table T, Composition T provides a Pt removal rate of 209 A/min and a BPSG removal rate of 432 A/min, demonstrating a Pt:BPSG selectivity of 1:2.

Composition U

Other preferred platinum polishing compositions (such as "Composition U") pursuant to the present invention comprise an alumina abrasive (alpha-, gamma-, or both), hydroxylamine hydrochloride (NH2OH.HCl), and DI water. It is believed that the hydroxylamine hydrochloride serves as an oxidizing agent. One example of component concentrations for Composition U is set forth below in Table XXI.

Composition U Component Concentration

TABLE XXI

| Typical Composition U | |
|---|---|
| Component | Component Concentration |
| Alpha-Alumina Abrasive (CR-30) | 2 wt % |
| $NH_2OH \cdot HCl$ | 0.1 mol/1 kg |
| DI Water | Remaining weight amount to obtain final desired amount of Composition U | pH Ranges

Composition U typically has a pH range from about 3.5 to about 4.5 and favorably a pH of about 4.

Preparation

Generally, Composition U is prepared by adding the alumina abrasive (such as CR-30) to a container of DI water and then adding the hydroxylamine hydrochloride ($NH_2OH.HCl$). Composition U is advantageously stirred continuously within the container during at least the composition preparation.

CMP Process

An example of the mixing ratio, process, removal rate and selectivity for Composition U is set forth in Table U below.

Mixing Ratio, Process, pH, Removal Rates and Selectivity

TABLE U

| Mixing Ratio | Process | pH | Pt Removal Rate (A/min) | Removal Rate (A/min) BPSG | Pt:BPSG Selectivity |
|---|---|---|---|---|---|
| 2 wt % Alpha-Alumina Abrasive 0.1 mol/kg $NH_2OH \cdot HCl$ DI water | 2/0/200/18/150 | 4 | 393 | 70 | 5.6:1 |

The CMP process set forth in Table U was carried out using an IPEC 576 polisher with a Thomas West XY pad and employing a down force pressure of 2 psi, a back pressure of 0 psi, a table or platen speed of 200 rpm, a carrier speed of 18 rpm, and a composition flow rate of 150 ml/min. Composition U is advantageously stirred thoroughly before and during its use.

When employed according to the process of Table U, Composition U provides a Pt removal rate of 393A/min and a BPSG removal rate of 70 A/min, demonstrating a Pt:BPSG selectivity of approximately 5.6:1.

Those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A combination of a chemical mechanical polishing composition in contact with a substrate surface having at least one feature thereon comprising a noble metal, said combination comprising:

a) a substrate comprising submicron integrated circuits and having a surface having at least one feature thereon comprising a noble metal, said substrate surface contacting a chemical mechanical polishing composition comprising:
b) periodic acid in an amount from about 0.05 to about 0.3 moles/kilogram and
c) an abrasive;
wherein said periodic acid and said abrasive are present in a combined amount sufficient to render the substrate surface substantially planar and to maintain a polishing rate of between 300 Angstroms per minute to about 2000 Angstroms per minute upon chemical-mechanical polishing thereof.

2. The combination of claim 1, wherein the periodic acid is present in an amount from about 0.075 to about 0.3 moles/kilogram.

3. The combination of claim 1, wherein the periodic acid is present in an amount from about 0.075 to about 0.175 moles/kilogram.

4. The combination of claim 1, wherein the abrasive is present in an amount from about 0.2 to about 6 weight percent.

5. The combination of claim 1, wherein the abrasive is present in an amount from about 0.2 to about 4 weight percent.

6. The combination of claim 1, further comprising a pH-adjusting agent, wherein the pH is from about pH 5 to about pH 10.

7. The combination of claim 1, further comprising a pH-adjusting agent, wherein the pH is from about pH 1 to about pH 4.

8. The combination of claim 7, wherein the composition consists essentially of water, periodic acid, an abrasive, and a pH-adjusting agent is selected from the group consisting of a quaternary amine, an inorganic base, and any composition thereof.

9. The combination of claim 7, wherein the pH-adjusting agent comprises an agent selected from the group consisting of tetramethylammonium hydroxide, ammonium hydroxide, potassium hydroxide, sodium hydroxide, and any composition thereof.

10. The combination of claim 1, further comprising a suspension agent.

11. The combination of claim 10, wherein the suspension agent comprises an agent selected from the group consisting of an organic acid, a surfactant, a second abrasive, ammonium polymethacylate, hydrous sodium lithium magnesium silicate, and ethyl carbonate.

12. The combination of claim 1, wherein the abrasive comprises an abrasive having a Mohs hardness number of greater than about 6.5.

13. The combination of claim 1, wherein the abrasive comprises an abrasive selected from the group consisting of alumina, silica, zirconia, spinel, zirconium nitride, and any combination thereof.

14. The combination of any one of claims 1 through 10, wherein the abrasive comprises alumina.

15. The combination of any one of claims 1 Through 10, wherein the noble metal is selected from the group consisting of Ir, $IrO_2$, Pt, and any composition thereof.

16. The combination of claim 1, wherein said combined amount is sufficient to provide the substrate surface with a wafer-within-wafer-nonuniformity (WWNU) of less than about 12% upon polishing of the substrate surface with the composition.

17. The combination of claim 1, wherein said combined amount is sufficient to provide the substrate surface with a wafer-to-wafer-nonuniformity (WTWNU) of less than about 5%.

18. A combination of a chemical mechanical polishing composition in contact with a substrate surface having at least one feature thereon comprising a noble metal said combination comprising:
a) a substrate having a surface, wherein said surface comprises a dielectric material and has at least one feature thereon comprising a noble metal, and wherein said surface is contacting a composition comprising:
b) periodic acid in an amount from about 0.05 to about 0.3 moles/kilogram; and
c) an abrasive in an amount from about 0.2 to about 6 weight percent, said combination having a pH from above pH 5 to about pH 10;
and wherein on polishing the substrate surface with the composition contacting the surface the selectivity of the composition for polishing the noble metal-containing material over polishing the dielectric material is at least 1:1.

19. The combination of claim 18, wherein the amount of periodic acid is from about 0.075 to about 0.3 moles/kilogram.

20. The combination of claim 18, wherein the amount of periodic acid is from about 0.075 to about 0.175 moles/kilogram.

21. The combination of claim 18, wherein the amount of the abrasive is from about 0.2 to about 4 weight percent.

22. The combination of claim 18, wherein the pH is from about pH 6 to about pH 10.

23. The combination of claim 18, further comprising a pH-adjusting agent.

24. The combination of claim 23, wherein the pH-adjusting agent is selected from the group consisting of a quaternary amine, an inorganic base, and any composition thereof.

25. The combination of claim 23, wherein the pH-adjusting agent comprises an agent selected from the group consisting of tetramethylammonium hydroxide, ammonium hydroxide, potassium hydroxide, sodium hydroxide, and any combination thereof.

26. The combination of claim 18, further comprising a suspension agent.

27. The combination of claim 26, wherein the suspension agent comprises an agent selected from the group consisting of an organic acid, a surfactant, a second abrasive, ammonium polymethacylate, hydrous sodium lithium magnesium silicate, and ethyl carbonate.

28. The combination of claim 18, wherein the abrasive comprises an abrasive having a Mohs hardness number of greater than about 6.5.

29. The combination of claim 18, wherein the abrasive comprises an abrasive selected from the group consisting of alumina, silica, zirconia, spinel, zirconium nitride, and any composition thereof.

30. The combination of any one of claims 18 through 26, wherein the abrasive comprises alumina.

31. The combination of claim 18, wherein said composition provides the substrate surface with a wafer-to-wafer-nonuniformity (WTWNU) of less than about 5% upon chemical-mechanical polishing thereof.

32. The combination of claim 18 wherein the noble metal comprises Ir.

33. The combination of claim 18, wherein the feature comprises $IrO_2$.

34. The combination of claim 18, wherein the noble metal comprises platinum.

35. A combination of a composition in contact with a substrate surface having at least one feature thereon comprising a noble metal, the composition consisting essentially of:

1) water;
2) periodic acid in an amount from about 0.05 to about 0.3 moles/kilogram;
3) an abrasive in an amount from about 0.2 to about 6 weight percent; and
4) a pH-adjusting agent in an amount sufficient to cause the pH of the composition to be between about 1 to about 4 or between about 5 to about 10;
5) a suspension agent; and
6) a substrate surface having at least one feature thereon comprising a noble metal.

36. The combination of claim 35, wherein the noble metal comprises Ir.

37. The combination of claim 35, wherein the noble metal comprises $IrO_2$.

38. The combination of claim 35, wherein the noble metal comprises platinum.

39. The combination of claim 35, wherein the noble metal comprises gold.

40. The combination of claim 35, wherein the noble metal comprises silver.

41. The combination of claim 35, wherein the abrasive consists essentially of alpha-alumina.

42. The combination of claim 35, wherein the abrasive consists essentially of gamma-alumina.

43. The combination of claim 35, wherein the abrasive consists essentially of alpha-alumina and gamma-alumina.

44. The combination of claim 35, wherein the substrate further comprises a dielectric material, and wherein the selectivity of the composition for polishing the noble metal-containing material over polishing the dielectric material is at least 1:1.

45. The combination of claim 35 wherein the pH-adjusting agent is selected from the group consisting of a quaternary amine, an inorganic base, and any combination thereof.

46. The combination of claim 35, wherein the suspension agent is selected from the group consisting of an organic acid, surfactant, ethyl carbonate, aluminum oxide, hydrous sodium lithium magnesium silicate, ammonium polymethacrylate, and a second abrasive.

47. The combination of claim 46, wherein the organic acid is succinic acid.

48. The combination of claim 46, wherein the second abrasive is silica.

* * * * *